United States Patent [19]

Havemann

[11] Patent Number: 5,252,502
[45] Date of Patent: Oct. 12, 1993

[54] METHOD OF MAKING MOS VLSI SEMICONDUCTOR DEVICE WITH METAL GATE

[75] Inventor: Robert H. Havemann, Garland, Tex.

[73] Assignee: Texas Instruments Incorporated, Dallas, Tex.

[21] Appl. No.: 924,209

[22] Filed: Aug. 3, 1992

[51] Int. Cl.$^5$ .................... H01L 21/265; H01L 21/44
[52] U.S. Cl. ........................ 437/41; 437/192; 437/200; 437/21; 437/913; 257/282; 257/384; 257/388; 257/412
[58] Field of Search ............ 437/41, 200, 192, 21, 437/29, 913, 918; 257/388, 412, 282, 346, 384, 915

[56] References Cited

U.S. PATENT DOCUMENTS

| | | | |
|---|---|---|---|
| 3,887,993 | 6/1975 | Okada et al. | 437/200 |
| 4,643,777 | 2/1987 | Maeda | 437/200 |
| 4,661,374 | 4/1987 | Doering | 437/200 |
| 4,821,085 | 4/1989 | Haken et al. | |
| 5,043,300 | 8/1991 | Nulman | 437/200 |
| 5,081,066 | 1/1992 | Kim | 437/200 |

Primary Examiner—Olik Chaudhuri
Assistant Examiner—H. Jey Tsai
Attorney, Agent, or Firm—Richard A. Stoltz; Richard L. Donaldson; William E. Hiller

[57] ABSTRACT

This is a method of fabricating a transistor on a wafer. The method comprises: forming an oxide layer 40 on a doped silicon layer 32; depositing a first resist over the oxide 40 and patterning the resist with a gate oxide configuration having a predetermined gate oxide length; etching to remove portions of the oxide layer 40 to expose portions of the silicon layer 32 using the resist as a mask; depositing a metal layer 42 over remaining portions of the oxide layer and exposed portions of the silicon layer; annealing the wafer to react portions of the metal layer with exposed portions of the silicon layer to form a metal silicide 44; depositing a second resist over the metal and patterning the second resist with a gate configuration having a gate length A smaller than the gate oxide length B; etching the metal to form a metal gate 42 and exposing portions of gate oxide; and implanting dopant adjacent the gate through the exposed gate oxide to provide source/drain regions 38 aligned to edges of the gate, utilizing the metal gate 42 as a mask to substantially prevent doping underneath the gate, whereby the gate need not be precisely centered on the gate oxide and thus difficulties in alignment are substantially eliminated.

15 Claims, 8 Drawing Sheets

METHOD OF MAKING MOS VLSI SEMICONDUCTOR DEVICE WITH METAL GATE

FIELD OF THE INVENTION

This invention generally relates to the manufacture of semiconductor devices with metal gates.

BACKGROUND OF THE INVENTION

Without limiting the scope of the invention, its background is described in connection with high density metal-oxide-semiconductor (MOS) devices, and more particularly, to a high density metal-oxide-semiconductor structure which has metal silicide regions in the doped regions and metal gates.

Since the invention of the integrated circuit, work has been done to increase the number of components per unit of chip area and to improve device performance. The first integrated circuits were bipolar devices and used the junction isolation technique. However, as the demand for smaller and smaller devices increased, new technologies were developed which had higher packing density than bipolar devices. The self-isolating metal-oxide-semiconductor devices have now substantially replaced bipolar devices where very high packing density is required, such as in memories and microprocessors. As the demand for faster, higher density metal-oxide-semiconductor devices continues, improvements in fabrication technology are necessary to keep pace with the demand.

In the manufacture of very high density and high performance MOS VLSI devices such as the RISC microprocessors and 4-Megabit static RAMS (SRAMS), the electrical resistance of small-geometry elements has generally necessitated the use of a silicide cladding for polysilicon and source/drain regions. A self-aligned silicide, or "salicide" process is typically used to provide this cladding, and may be combined with a local interconnect to achieve smaller SRAM cell size. See U.S. Pat. No. 4,821,085 issued to Haken et al. on Apr. 11, 1989. Smaller SRAM cell size can also be achieved by using a polysilicon resistor load (4 transistor/2 resistor cell) or a thin film transistor (TFT) load device.

Heretofore, in this field, TFT devices are normally formed by using one layer of polysilicon for the transistor body and another (overlying or underlying) layer of polysilicon for the transistor gate, with a gate oxide in between. This approach places severe constraints on the process in terms of low temperature processing and hinders the use of silicides to lower the resistance of the polysilicon and the source/drain regions.

SUMMARY OF THE INVENTION

It is herein recognized that a need exists for thin film transistors with metal gates which are compatible with the use of silicides and local interconnects. The present invention is directed towards meeting those needs.

Generally, and in one form of the invention, the structure while also requiring a certain degree of limited thermal processing, is totally compatible with the use of a local interconnect such as titanium nitride, for example. This invention describes a structure and method for forming a MOS field effect transistor using a polysilicon body deposited on an insulator with an overlying gate oxide and metal gate.

An advantage of the invention is that a metal refractory gate can be made at the same time as the silicide (and the local interconnect if required). The metal gate may consist of titanium nitride and the resulting silicide would be $TiSi_2$. Alternately, other metals (for example, cobalt, nickel . . . ) could also be used along with the resulting silicides. In addition, another advantage to the invention would be the use of a TFT gate and local interconnect material to provide circuit connections for the TFT without requiring a separate contact level. Furthermore, using an isotropic wet etch to remove the excess metal above the source/drain regions, would self-align the metal gate with the source/drain regions.

This is a method of fabricating a transistor on a wafer. The method comprises: forming an oxide layer on a doped silicon layer; depositing a first resist layer over the oxide and patterning the resist with a gate oxide configuration having a predetermined gate oxide length; etching to remove portions of the oxide layer to expose portions of the silicon layer using the resist as a mask; depositing a metal layer over remaining portions of the oxide layer and exposed portions of the silicon layer; annealing the wafer to react portions of the metal layer with exposed portions of the silicon layer to form a metal silicide; depositing a second resist over the metal and patterning the second resist with a gate configuration having a gate length smaller than the gate oxide length; etching the metal to form a metal gate and exposing portions of gate oxide; and implanting dopant adjacent the gate through the exposed gate oxide to provide source/drain regions aligned to edges of the gate, utilizing the metal gate as a mask to substantially prevent doping underneath the gate, whereby the gate need not be precisely centered on the gate oxide and thus difficulties in alignment are substantially eliminated.

Preferably, dopant implanting is through both the gate oxide and the sicicide; forming of source/drains is by ion-implantation; the metal gate is titanium nitride and the silicide is titanium silicide, the silicon layer is single crystal and the silicon layer serves as a substrate.

Alternately, a step of forming source/drains may be utilized after patterning the first resist but before etching the gate oxide layer; and the implanting of dopant adjacent to the gate provides low level drain extensions.

Alternately, the metal may be cobalt and silicide is cobalt silicide.

Alternately, the metal may be nickel and silicide is nickel silicide.

Alternately, the silicon layer may be polycrystalline and annealed to provide enlarged crystals of silicon.

Alternately, the silicon may be formed on an insulator such as a thick field oxide.

Alternately, the metal may be etched to form the local interconnect as well as the metal gate with an isotropic wet etch which would self-align the metal gate with the source/drain regions.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

The term metal-oxide-semiconductor (MOS) is defined for purposes of this disclosure as including structures in which an insulator (or combination of insulators) is sandwiched between a conductor and a semiconductor. This definition will be understood to include structures where polycrystalline silicon is the conductor.

FIGS. 1a–1l depict successive stages of the manufacture of a MOS field effect transistor shown in cross-section.

Figure 1A:
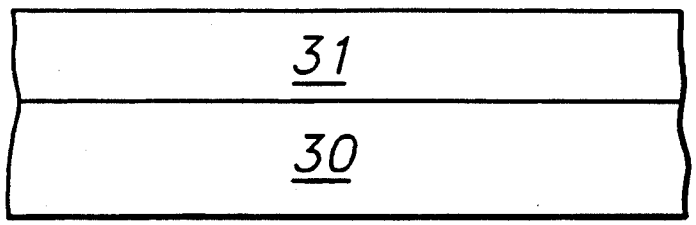
FIGS. 1a-1k are elevation views in section of a part of a semiconductor integrated circuit chip at successive stages.

(a) In FIG. 1a, the transistor is made by depositing a thin (1–2 KÅ, for example) amorphous silicon or polysilicon layer 31 on an insulator 30 (such as thick field oxide, for example). Then, the layer 31 is annealed to enlarge (or to form polycrystalline and enlarge, if the silicon was initially amorphous) the grain size so as to simulate a single crystalline substrate.

Figure 1B:
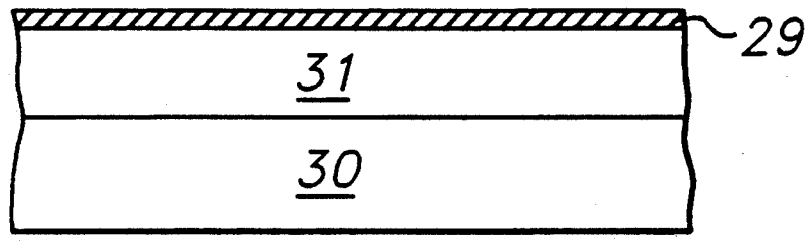

(b) In FIG. 1b, a dummy gate is grown on top of the silicon layer 31.

Figure 1C:
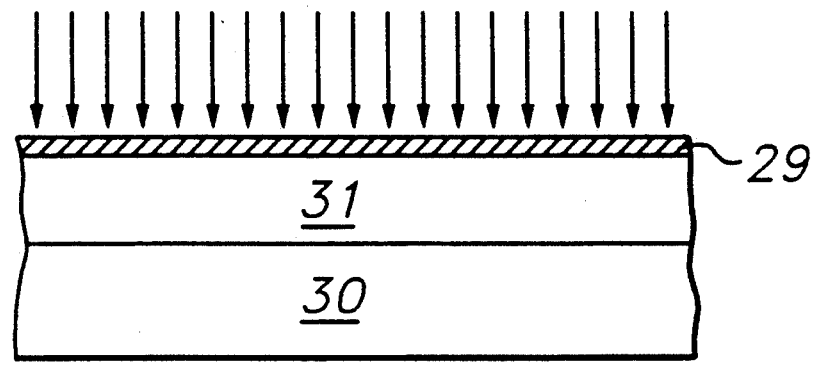

(c) In FIG. 1c, the appropriate dopant is implanted to make the NMOS or PMOS transistor body. Additional dopant may be added to make the threshold voltage in the channel area.

Figure 1D:
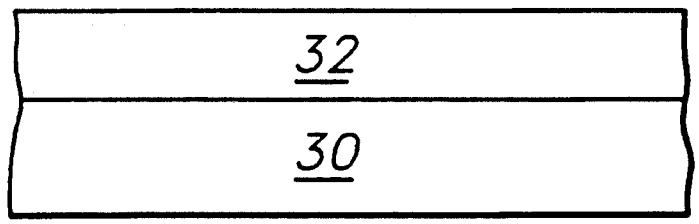

(d) In FIG. 1d, the doped polysilicon layer 32 is shown on top of the insulator 30.

Figure 1E:
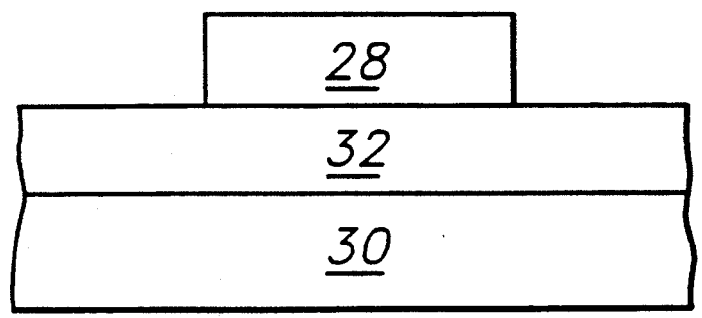

(e) In FIG. 1e, a resist layer 28 is patterned on top of the polysilicon layer 32.

Figure 1F:
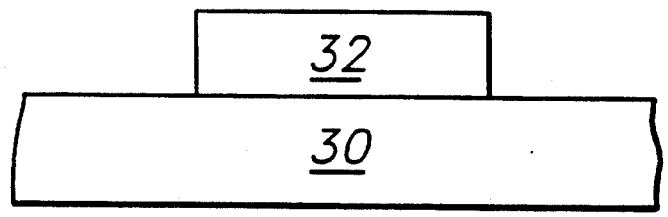

(f) In FIG. 1f, after the resist layer (not shown) and the polysilicon layer 32 are etched, the resist layer is removed to leave the polysilicon layer 32 shown in FIG. 1f.

Figure 1G:
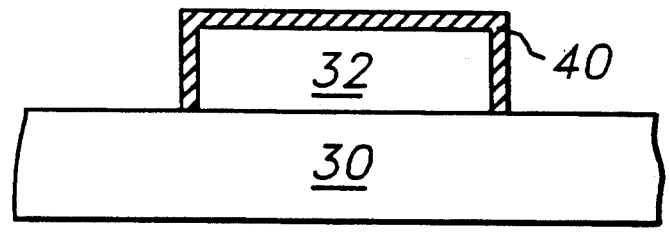

(g) In FIG. 1g, a gate oxide 40 is then deposited or grown on top of a suitably cleaned polysilicon layer 32. (This gate oxide 40 may be 100 Å in thickness and grown by thermal oxidation.)

Figure 1H:
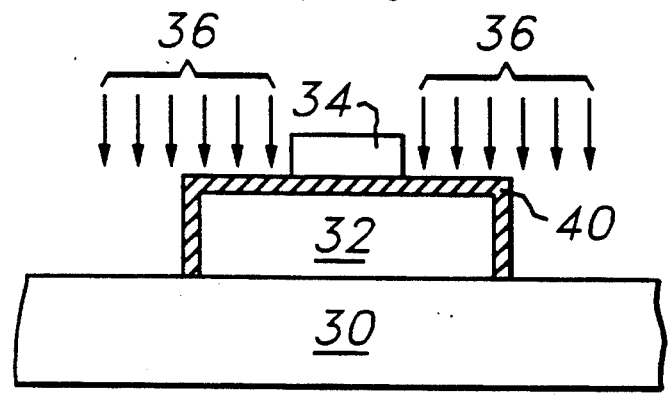

(h) In FIG. 1h, patterned photoresist 34 and the source/drain regions are implanted and the oxide is removed from the source/drain regions 38 while the photoresist 34 is still in place (implantation may be before or after oxide removal). The gate oxide 40 remains under the photoresist and along the sidewalls of the polysilicon layer 32. Photoresist 34 is then removed and the source/drain regions 38 are annealed at a low temperature.

Figure 1I:
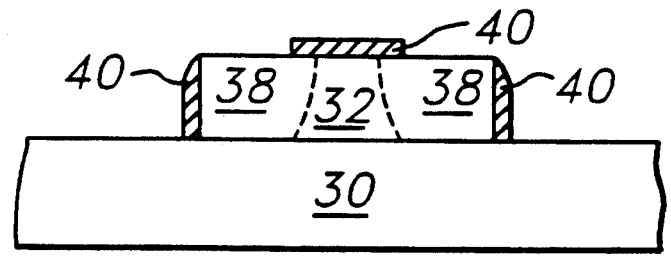

(i) In FIG. 1i, the polysilicon layer 32 is shown with the gate oxide 40 above the channel area and along the sidewalls of the polysilicon layer 32.

Figure 1J:
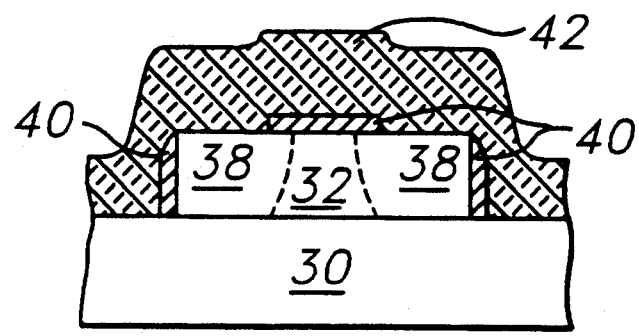

(j) In FIG. 1j, refractory metal 42 is deposited over the gate oxide 40 and the polysilicon layer 32 (the metal could, for example, be titanium or cobalt.)

Figure 1K:
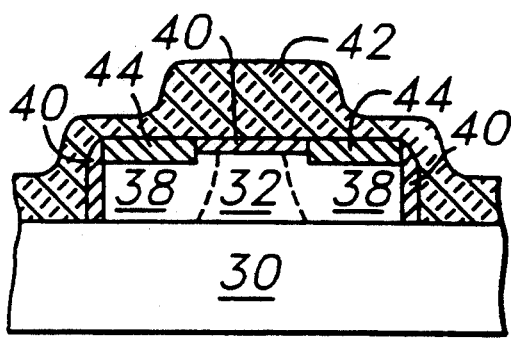

(k) In FIG. 1k, annealing forms a silicide where the polysilicon layer 32 is exposed to the refractory metal. The silicided regions 44 are formed in the polysilicon layer above the source/drain regions 38 (alternately, for normal MOS field effect transistors, single crystal silicon source/drain regions can be silicided as well). Since the refractory metal 42 combines with the polysilicon layer 32 to create the silicide 44, the titanium region is thinner in the area above the silicide 44.

Figure 1L:
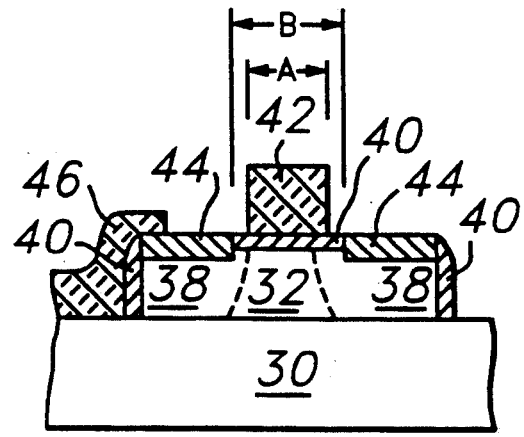
FIG. 1l is an elevation view in section of a part of a semiconductor integrated chip showing an MOS transistor made according to the invention thereof.

(l) In FIG. 1l, the metal is patterned and the excess removed leaving the metal gate 42. It can be seen that the gate length A is smaller than the gate oxide length B. The local interconnect 46 is also formed from the deposited metal. Alternately, an isotropic wet etch material could be used to etch the metal gate 42 (since the metal over the source/drain regions is thinner than the metal in the gate region, the wet etch would etch all of the metal above the source/drain regions and leave enough metal in the gate region to form the metal gate 42).

One disadvantage to the process described in FIGS. 1a–1l, is that the gate is not self-aligned to the source/drain regions. If low temperature (<=700 degrees Celsius) processing and/or rapid thermal annealing techniques could be used to achieve reasonable source/drain activation, then the implant could be performed in a self-aligned manner as shown in FIGS. 2a–2m.

FIGS. 2a–2m depict successive stages of an alternate manufacturing approach for a MOS field effect transistor shown in cross-section.

Figure 2A:
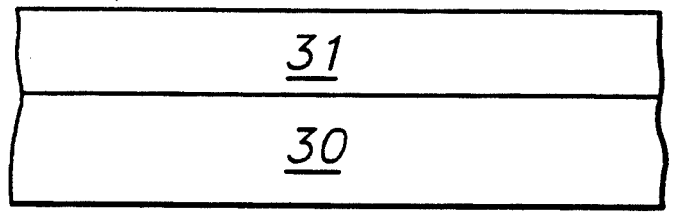
FIGS. 2a–2l are elevation views in section of a part of a semiconductor integrated circuit chip at successive stages.

(a) In FIG. 2a, the transistor is made by depositing a thin (1–2 KÅ, for example) amorphous silicon or polysilicon layer 31 on an insulator 30 (such as thick field oxide, for example). Then, the layer 31 is annealed to enlarge (or to form polycrystalline and enlarge, if the silicon was initially amorphous) the grain size so as to simulate a single crystalline substrate.

Figure 2B:
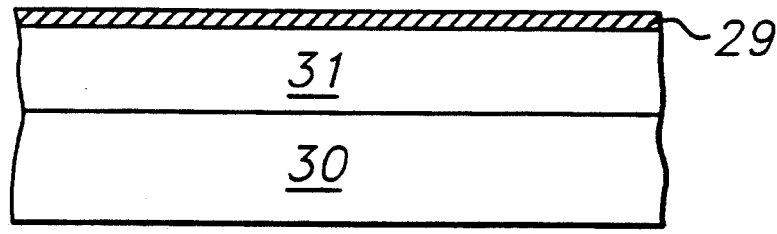

(b) In FIG. 2b, a dummy gate oxide 29 is grown on top of the silicon layer 31.

Figure 2C:
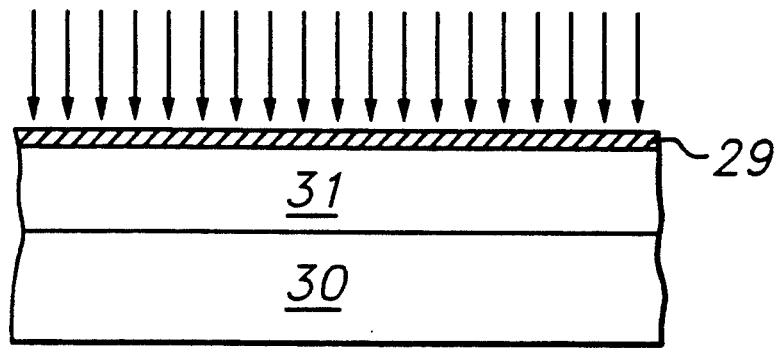

(c) In FIG. 2c, the appropriate dopant is implanted to make the NMOS or PMOS transistor body. Additional dopant may be added to make the threshold voltage in the channel area.

Figure 2D:
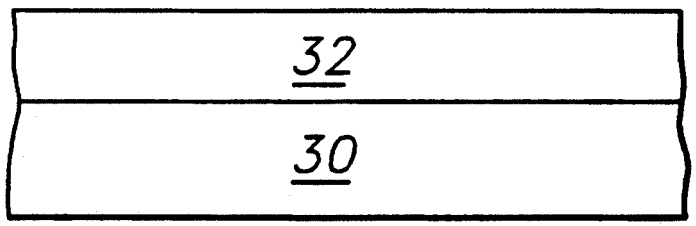

(d) In FIG. 2d, the doped polysilicon layer 32 is shown on top of the insulator 30.

Figure 2E:
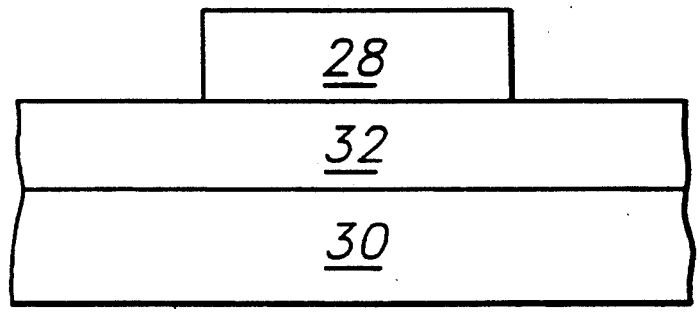

(e) In FIG. 2e, a resist layer 28 is patterned on top of the polysilicon layer 32.

Figure 2F:
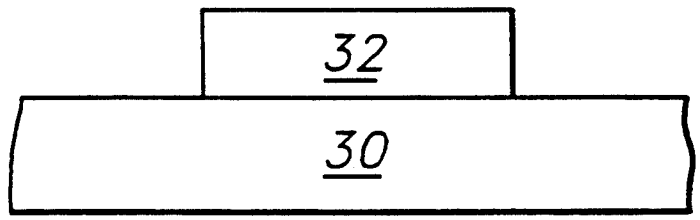
Figure 3A:
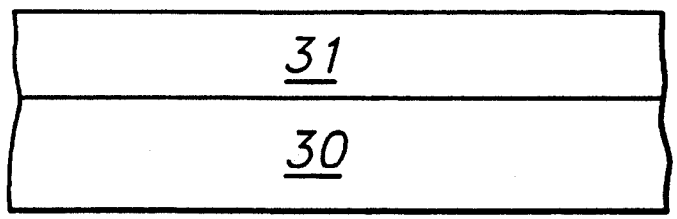
FIGS. 3a–3n are elevation views in section of a part of a semiconductor integrated circuit chip at successive stages.
Figure 3B:
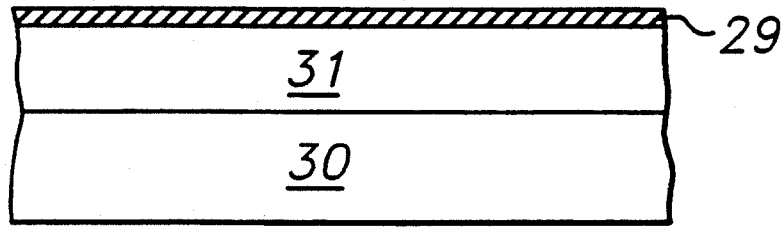
FIG. 3o is an elevation view in section of a part of a semiconductor integrated chip showing an MOS transistor made according to the invention thereof.
Figure 3C:
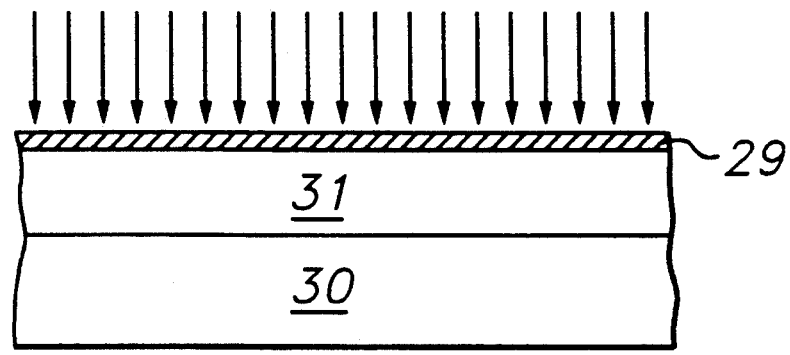
Figure 3D:
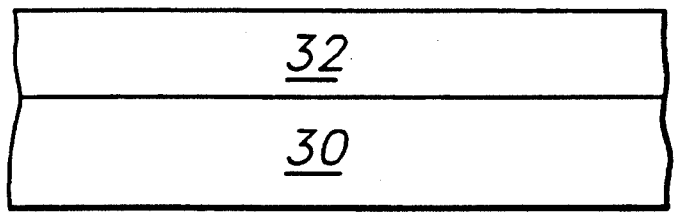
Figure 3E:
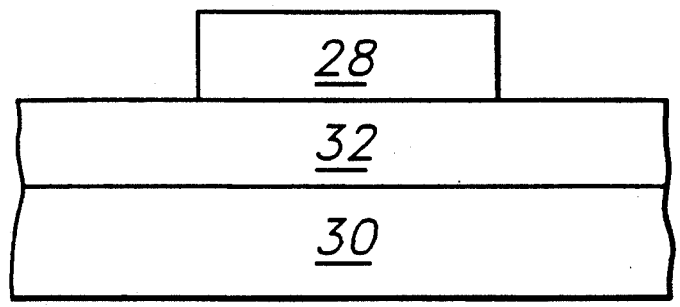
Figure 3F:
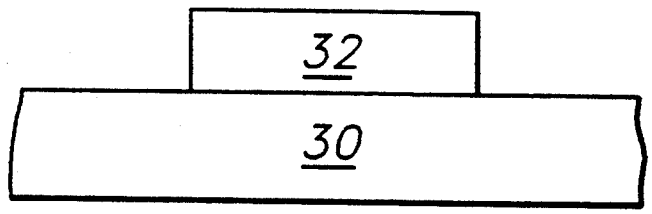

(f) In FIG. 2f, after the resist layer (not shown) and the polysilicon layer 32 are etched, the resist layer is removed to leave the polysilicon layer 32 shown in FIG. 3f.

Figure 2G:
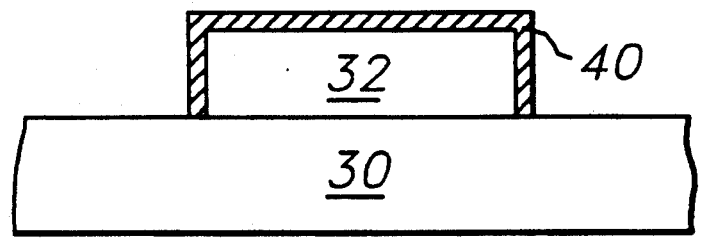

(g) In FIG. 2g, a gate oxide 40 is then deposited or grown on top of a suitably cleaned polysilicon layer 32. (This gate oxide 40 may be 100 Å in thickness and grown by thermal oxidation.)

Figure 2H:
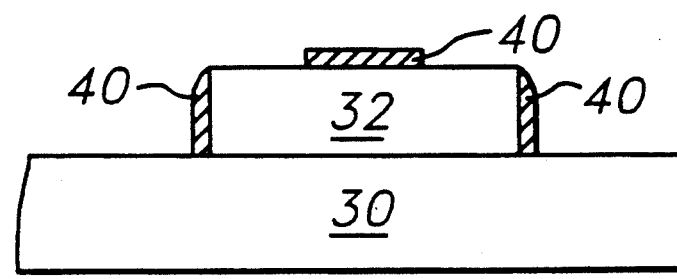

(h) In FIG. 2h, the gate oxide 40 is etched using patterned photoresist (not shown) to leave the gate oxide 40 above the channel area and along the sidewalls of the polysilicon layer 32.

Figures 2I, 2J:
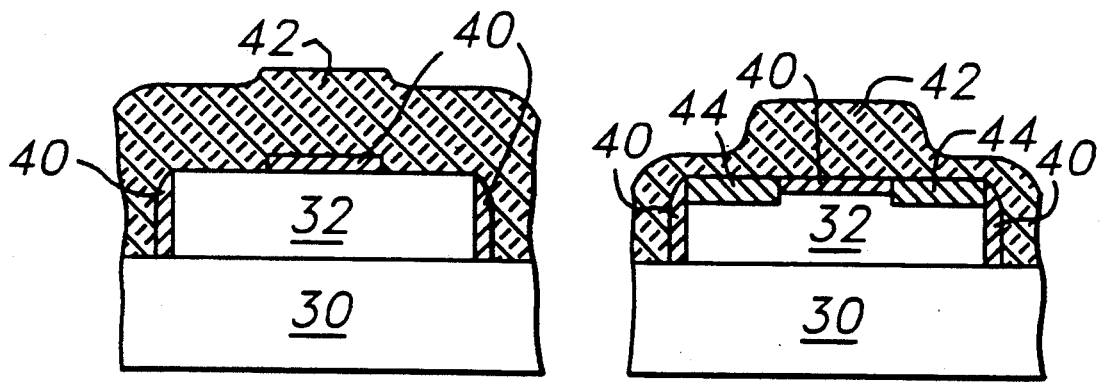

(i) In FIG. 2i, a metal 42 is deposited over the gate oxide 40 and the polysilicon layer 32.

(j) In FIG. 2j, the structure is then annealed and the lower part of the metal reacts with the exposed polysilicon layer 32 to create a thin layer of silicide 44 (titanium silicide if refractory metal is titanium nitride). As described in the previous figures, since the refractory metal 42 combines with the polysilicon layer 32 to create the silicide 44, the titanium nitride region is thinner in the area above the silicide 44.

Figure 2K:
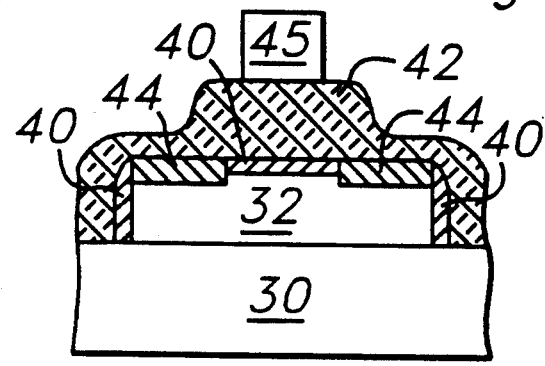

(k) In FIG. 2k, a photoresist 45 is applied and patterned.

Figure 2L:
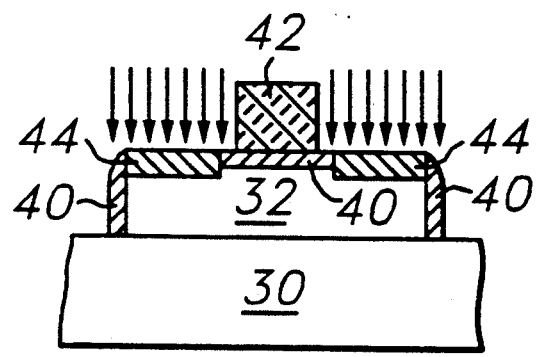

(l) In FIG. 2l, the photoresist and the unreacted metal are then etched to leave a metal gate 42. As indicated in the previous figures, alternately, an isotropic wet etch material could be used to etch the metal gate 42 (since the metal over the source/drain regions is thinner than the metal in the gate region, the wet etch would etch all of the metal above the source/drain regions and leave enough metal in the gate region to form the metal gate 42). As also described in the previous figures, the polysilicon 32 would have an appropriate dopant. The source/drain regions are then patterned and implanted with a conductivity type opposite that of the polysilicon layer 32. Low temperature (<700 degrees Celsius) processing and/or rapid thermal annealing techniques can be used to achieve reasonable source/drain activation.

Figure 2M:
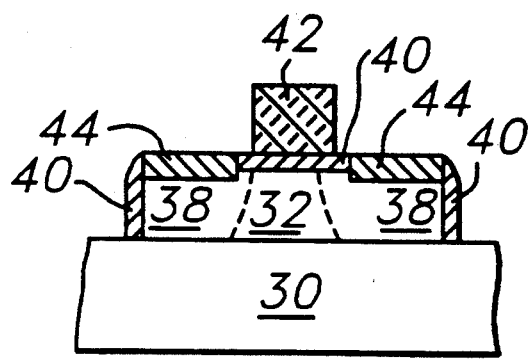
FIG. 2m is an elevation view in section of a part of a semiconductor integrated chip showing an MOS transistor made according to the invention thereof.

(m) In FIG. 2m, the dopant is then annealed so as to diffuse from the silicide to form the source/drain regions 38, while also forming a junction in the polysilicon layer 32 near the gate 42. As the gate 45 has been used as a mask for the implant, the source/drains 38 are thus self-aligned.

Figure 3G:
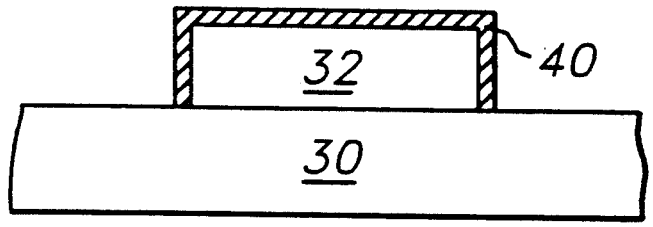
Figure 3H:
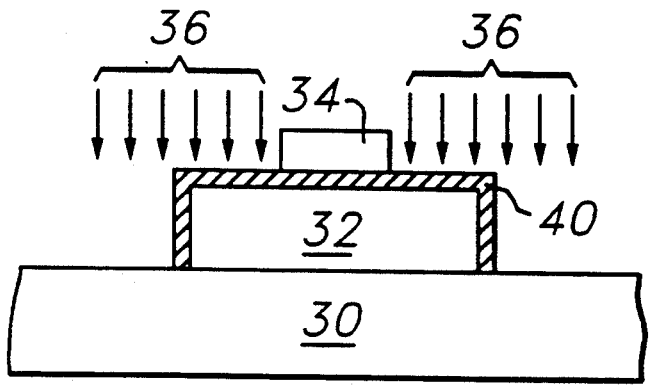
Figure 3I:
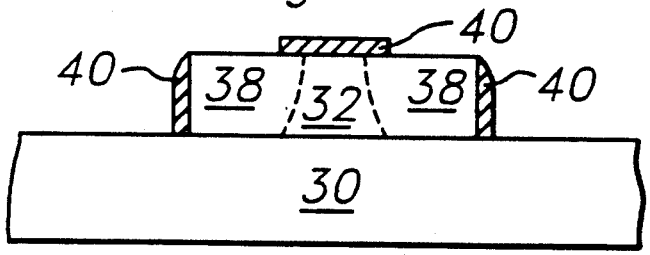
Figure 3J:
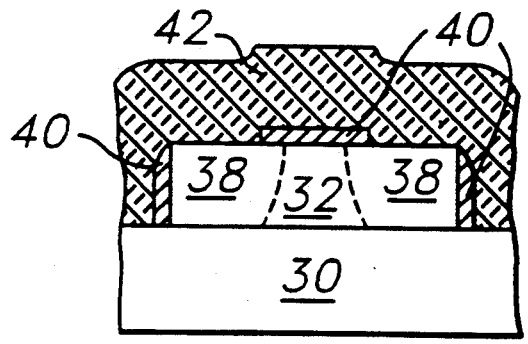
Figure 3K:
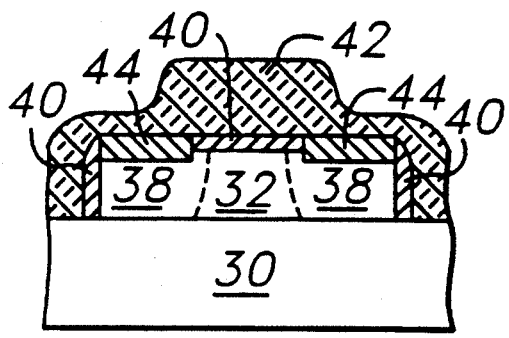
Figure 3L:
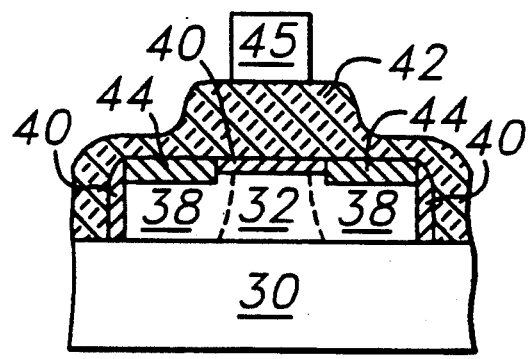
Figure 3M:
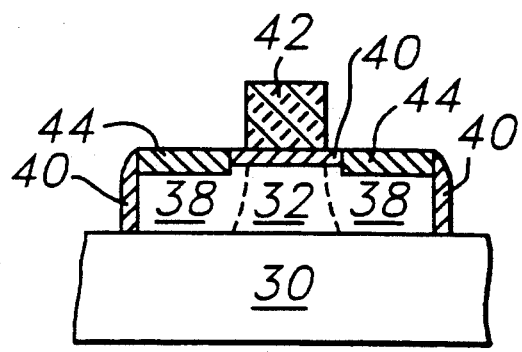
Figure 3N:
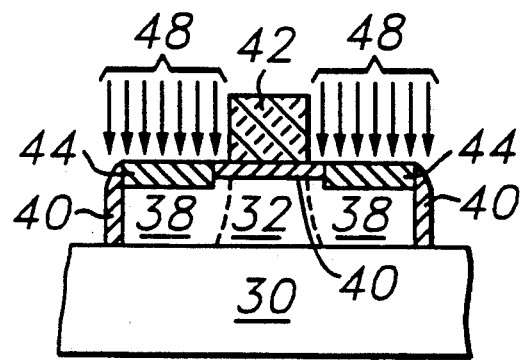
Figure 3O:
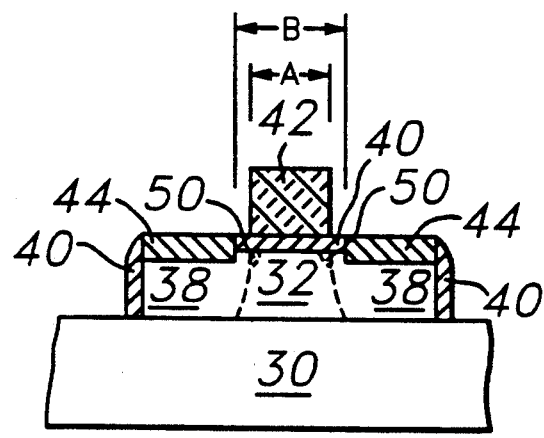

In FIGS. 3a–3o, the results of an alternate preferred approach are shown. This approach would be similar to the process described in FIGS. 1a–1l, but the source/drain regions are formed before silicide, and then a region of lower doping is provided by a reach through implant to provide an extension to the source/drains. With this approach, the more heavily doped regions is formed before silicidation, but the source/drain region is still self-aligned to the gate edge, as the source/drain extension provides the linkage to the active channel. This approach is explained further below.

(a) In FIG. 3a, the transistor is made by depositing a thin (1-2 KÅ, for example) amorphous silicon or polysilicon layer 31 on an insulator 30 (such as thick field oxide, for example). Then, the layer 31 is annealed to enlarge (or to form polycrystalline and enlarge, if the silicon was initially amorphous) the grain size so as to simulate a single crystalline substrate.

(b) In FIG. 3b, a dummy gate is grown on top of the silicon layer 31.

(c) In FIG. 3c, the appropriate dopant is implanted to make the NMOS or PMOS transistor body. Additional dopant may be added to make the threshold voltage in the channel area.

(d) In FIG. 3d, the doped polysilicon layer 32 is shown on top of the insulator 30.

(e) In FIG. 3e, a resist layer 28 is patterned on top of the polysilicon layer 32.

(f) In FIG. 3f, after the resist layer (not shown) and the polysilicon layer 32 are etched, the resist layer is removed to leave the polysilicon layer 32 shown in FIG. 3f.

(g) In FIG. 3g, a gate oxide 40 is then deposited or grown on top of a suitably cleaned polysilicon layer 32. (This gate oxide 40 may be 100 Å in thickness and grown by thermal oxidation.)

(h) In FIG. 3h, the source/drain regions are patterned and implanted and the oxide is removed from the source/drain regions 38 while the mask 34 is still in place. Then, the source/drain regions 38 are annealed at a low temperature.

(i) In FIG. 3i, the gate oxide 40 is etched using patterned photoresist (not shown) to leave the gate oxide 40 above the channel area and along the sidewalls of the polysilicon layer 32.

(j) In FIG. 3j, the refractory metal 42 is deposited over the gate oxide 40 and polysilicon layer 32.

(k) In FIG. 3k, annealing forms the silicide 44 where the polysilicon layer 32 is exposed. The silicided regions 44 are formed above the polycrystalline source/drain regions 38, these processes can, for normal MOS field effect transistors, be used with single crystal silicon source/drain regions as well. As described in the previous figures, since the refractory metal 42 combines with the polysilicon layer 32 to create the silicide 44, the titanium nitride region is thinner in the area above the silicide 44.

(l) In FIG. 3l, the photoresist 45 is patterned on top of the metal in the form of the metal gate. As indicated in the previous figures, alternately, an isotropic wet etch material could be used to etch the metal gate 42 (since the metal over the source/drain regions is thinner than the metal in the gate region, the wet etch would etch all of the metal above the source/drain regions and leave enough metal in the gate region to form the metal gate 42).

(m) In FIG. 3m, the metal is etched and the excess removed to form the metal gate 42 (a local interconnect may also be formed from the deposited metal, if required).

(n) In FIG. 3n, a region of lower doping 48 is provided by a reachthrough implant to provide an extension to the active channel.

(o) In FIG. 3o, the extensions 50 are shown in relation to the gate. It can be seen that the gate length A is significantly smaller than the gate oxide length B. With this approach, the source/drain is still self-aligned to the gate edge, but the more heavily doped regions are formed before silicidation.

A few preferred embodiments have been described in detail hereinabove. It is to be understood that the scope of the invention also comprehends embodiments different from those described, yet within the scope of the claims. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a transistor on a wafer comprising:

a. forming an oxide layer on a doped silicon layer;
  b. depositing a first resist over said oxide and patterning said resist with a gate oxide configuration having a predetermined gate oxide length;
  c. etching to remove portions of said oxide layer to expose portions of said silicon layer using said first resist as a mask;
  d. depositing a metal layer over remaining portions of said oxide layer and exposed portions of said silicon layer;
  e. annealing said wafer to react portions of said metal layer with exposed portions of said silicon layer to form a metal silicide;
  f. depositing a second resist over said metal layer and patterning said second resist with a gate configuration having a gate length smaller than said gate oxide length;
  g. etching said metal layer to form a metal gate and exposing portions of gate oxide; and
  h. implanting dopant adjacent said gate through said exposed gate oxide to provide source/drain regions aligned to edges of said gate, utilizing said metal gate as a mask to substantially prevent doping underneath said gate, whereby said gate need not be precisely centered on said gate oxide and thus difficulties in alignment are substantially eliminated.

2. The method of claim 1, wherein said implanting is through both said gate oxide and said silicide.

3. The method of claim 1, wherein a step of forming source/drains is utilized after patterning said first resist but before etching said gate oxide layer; and said implanting of dopant adjacent said gate provides low level drain extensions.

4. The method of claim 3, wherein said forming of source drains is by ion-implantation.

5. The method of claim 1, wherein said metal is titanium nitride and said silicide is titanium silicide.

6. The method of claim 1, wherein said metal is cobalt and said silicide is cobalt silicide.

7. The method of claim 1, wherein said metal is nickel and said silicide is nickel silicide.

8. The method of claim 1, wherein said metal is a refractory metal and the silicide is the corresponding silicide compound.

9. The method of claim 1, wherein said silicon layer is single crystal and said silicon layer serves as a substrate.

10. The method of claim 1, wherein said silicon layer is polycrystalline.

11. The method of claim 10, wherein said polycrystalline silicon layer is annealed to provide enlarged crystals of silicon.

12. The method of claim 1, wherein said silicon layer is formed on an insulator.

13. The method of claim 13, wherein said insulator is a thick field oxide.

14. The method of claim 1, wherein said metal is etched with an isotropic wet etch, whereby the metal gate is self-aligned with the source/drain regions.

15. The method of claim 1, wherein said metal gate is formed simultaneously with a local interconnect.

* * * * *